US006313529B1

(12) United States Patent
Yoshihara et al.

(10) Patent No.: US 6,313,529 B1
(45) Date of Patent: Nov. 6, 2001

(54) BUMP BONDING AND SEALING A SEMICONDUCTOR DEVICE WITH SOLDER

(75) Inventors: Shinji Yoshihara, Nagoya; Shigeyuki Akita, Okazaki, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/131,169

(22) Filed: Aug. 7, 1998

(30) Foreign Application Priority Data

Aug. 8, 1997 (JP) .................................................. 9-214574

(51) Int. Cl.[7] .................................................. H01L 23/34
(52) U.S. Cl. .......................... 257/724; 257/778; 257/780
(58) Field of Search .................................. 257/415, 419, 257/692, 698, 701, 724, 778, 787, 780, 416, 417; 438/50, 51, 52, 108, 127, 48

(56) References Cited

U.S. PATENT DOCUMENTS

| 3,591,839 | * | 7/1971 | Evans ..................... 257/701 |
| 3,657,610 | * | 4/1972 | Yamamoto et al. ................ 257/778 |
| 4,129,042 | | 12/1978 | Rosvold ................................. 73/727 |
| 4,891,984 | | 1/1990 | Fujii et al. ......................... 73/514.33 |
| 5,006,487 | | 4/1991 | Stokes .................................... 438/50 |
| 5,164,328 | * | 11/1992 | Dunn et al. ............................. 438/51 |
| 5,243,861 | | 9/1993 | Kloeck et al. ....................... 257/415 |
| 5,260,514 | * | 11/1993 | Fruen, Jr. .............................. 257/692 |
| 5,448,114 | * | 9/1995 | Kondoh et al. ....................... 257/778 |
| 5,500,549 | | 3/1996 | Takeuchi et al. ..................... 257/415 |
| 5,668,033 | | 9/1997 | Ohara et al. ............................ 438/50 |
| 5,705,858 | * | 1/1998 | Tsukamoto ........................... 257/778 |
| 5,723,904 | * | 3/1998 | Shiga ..................................... 257/698 |
| 5,734,106 | * | 3/1998 | Caillat .................................... 438/48 |
| 5,747,353 | * | 5/1998 | Bashir et al. .......................... 438/48 |

FOREIGN PATENT DOCUMENTS

| 36-3250865 | * | 10/1988 | (JP) ...................................... 257/415 |
| 40-5007006 | * | 1/1993 | (JP) ...................................... 257/415 |
| 5-21128 | | 8/1993 | (JP) . |
| 6-347475 | | 12/1994 | (JP) . |
| 7-183543 | | 7/1995 | (JP) . |
| 7-245416 | | 9/1995 | (JP) . |
| 9126920-A | * | 5/1997 | (JP) . |

\* cited by examiner

*Primary Examiner*—Olik Chaudhuri
*Assistant Examiner*—Theresa T. Doan
(74) *Attorney, Agent, or Firm*—Pillsbury Winthrop LLP

(57) ABSTRACT

On a circuit chip on which a processing circuit for sensor outputs is formed, bump electrodes and a sealing bump, which has a shape of rectangular frame and is arranged to surround the bump electrodes, are formed by Sn—Pb solder. On a sensor chip provided with a sensing portion, electrode pads to be bonded to the bump electrode and a joining pad to be bonded to the sealing bump are formed. When the sensor chip is connected onto the circuit chip, an air-tight space containing the sensing portion is formed by the sealing bump and the joining pad.

20 Claims, 12 Drawing Sheets

IRRADIATION OF ULTRAVIOLET RAYS

BUMP BONDING AND SEALING A SEMICONDUCTOR DEVICE WITH SOLDER

CROSS REFERENCE TO RELATED APPLICATION

This application is based upon and claims the benefit of priority of prior Japanese Patent Application No. H.9-214574 filed on Aug. 8, 1997, the contents of which are incorporated by reference.

BACKGROUND OF THE INVENTION

1. Field of the Invention

The present invention relates to a semiconductor device provided with a semiconductor sensor chip including a structural member which is displaced in accordance with physical quantity applied thereto in order to detect the physical quantity such as acceleration and yaw rate, and a manufacturing method thereof.

2. Description of Related Art

For example, an electrostatic capacity type semiconductor acceleration sensor is provided with a beam structure which is displaced in response to an acceleration applied thereto. A sensor chip provided with a sensing portion including the beam structure is manufactured by use of a surface micro machining technique applied to semiconductor materials. Because the semiconductor acceleration sensor as described above is easily miniaturized and has good consistency with a semiconductor manufacturing process, the sensing portion and a sensor circuit for carrying out control of the sensing portion and processing of sensor outputs are formed together in a common semiconductor chip.

As a form of a package to house such a semiconductor acceleration sensor, a resin-molded package is most suitable to reduce the cost of production. However, when the resin-molded package is adopted, it is necessary to protect the beam structure having a small mechanical strength from pressure of molding resin. For this reason, conventionally, a protecting cap is provided on the semiconductor chip so as to cover the sensing portion and the sensor circuit.

In recent years, an acceleration sensor utilized in an air-bag system or a suspension control system of a vehicle is required to achieve miniaturization and low manufacturing cost. However, in a conventional arrangement in which the sensing portion and the sensor circuit stand in a single plane on the common semiconductor chip and the protecting cap is provided thereabove, it is difficult to meet the requirement of miniaturization and low cost. That is, in a conventional semiconductor acceleration sensor, not only the chip size thereof is two-dimensionally enlarged but also it is necessary to provide the protecting cap separately. Therefore, miniaturization of the sensor is very difficult. Further, because the chip size is two-dimensionally enlarged, the number of sensor chips taken from a single wafer is reduced. Furthermore, because the sensing portion and the sensor circuit are formed on the common chip, the number of steps in manufacturing process performed to the common chip is increased and a yield factor of the sensor chip is thereby decreased. As a result, the manufacturing cost of the sensor chip rises. This tendency becomes significant as a degree of integration and an area of the sensor circuit becomes large.

Also, as disclosed in Japanese Patent Application Laid-Open No. H.6-347475, there is a semiconductor sensor in which a sensor chip is disposed on a glass substrate and a protecting cover formed from a silicon plate provided with a signal processing circuit and a concave portion for housing the sensor chip is placed to cover the sensor chip. Due to such a structure, the semiconductor sensor can withstand molding resin.

However, in such a semiconductor sensor as well, because the sensor chip and the signal processing circuit are two-dimensionally arranged and the protecting cover is separately provided, the size thereof is enlarged in two-dimension. As a result, it is difficult to achieve miniaturization of the sensor as a whole. Further, because the glass substrate and the protecting cover (silicon plate) are bonded by anodic junction, a condition of air tightness may be insufficient. Furthermore, because a pulling-out electrode from the signal processing circuit is physically contacted with a pulling-out electrode from the glass substrate to connect them each other, contact resistance between the pulling-out electrodes may be increased. As a result, the reliability of operation of the sensor is low.

SUMMARY OF THE INVENTION

It is an object of the present invention to provide a semiconductor device in which, even though a sensing portion including a structural member which is displaced in accordance with physical quantity applied thereto and a processing circuit for an output from the sensing portion are integrally provided, miniaturization and low cost thereof can be achieved and the reliability of operation thereof can be enhanced and to provide a manufacturing method thereof.

According to the present invention, one face of a sensor chip constituted by a semiconductor substrate on which a sensing portion is formed is connected to a circuit chip on which a processing circuit for an output from the sensing portion is formed via bump electrodes to electrically connect the sensing portion and the processing circuit. Further, in this connected state, a sealing member is interposed between the sensor chip and the circuit chip so that the sensing portion is located in an air-tight space formed by the sealing member.

As a result, the sensor chip and the circuit chip are arranged in the so-called COC (chip on chip) structure. Therefore, the size of the semiconductor device is prevented from enlarging in two-dimension. Further, the sensor chip functions as a conventional protecting cap. Consequently, the size of the semiconductor device can be miniaturized as a whole.

Also, since the chip sizes of the sensor chip and the circuit chip can be made small, the number of chips obtained from a single wafer can be increased. Further, since the sensor chip and the circuit chip are formed separately to each other, the number of steps in manufacturing process performed with respect to each of chips can be reduced and the yield factor of each chip can be enhanced. Accordingly, the manufacturing cost of the semiconductor device can be decreased. Furthermore, because the air-tight space containing the sensing portion is formed by the sealing member, even when a resin-molded package of low cost is used to house the semiconductor device, the sensing portion does not receive adverse influences from the molding resin. In view of this aspect also, the reduction of the manufacturing cost can be promoted.

Electrical connection between the sensor chip and the circuit chip can be reliably ensured by the bump electrodes. Further, the sealing member can prevent liquid from invading into the air-tight space in which the sensing portion is located. Therefore, the reliability of operation in the semiconductor device can be enhanced.

The semiconductor device according to the present invention can be manufactured by a method as described below. First, in an electrode forming step, bump electrodes are formed on either one of a surface of the sensor chip on which the sensing portion is formed and a surface of the circuit chip, and electrode pads to be bonded to the bump electrodes are formed on the other thereof. In a sealing member forming step, in order to form the air-tight space containing the sensing portion, the sealing member of a rectangular frame shape is formed on either one of the surface of the sensor chip on which the sensing portion is formed and the surface of the circuit chip, a joining pad of the same frame shape to be bonded to the sealing member is formed on the other thereof.

Thereafter, in a connecting step, the bump electrodes are bonded to the electrode pads and the sealing member is bonded to the joining pad. As a result, the sensor chip is connected on the circuit chip, and the air-tight space containing the sensing portion is formed by the sealing member of the rectangular frame shape interposed between the sensor chip and the circuit chip.

BRIEF DESCRIPTION OF THE DRAWINGS

These and other objects, features, and characteristics of the present invention will be appreciated from a study of the following detailed description, the appended claims, and drawings, all of which form a part of this application. In the drawings:

DETAILED DESCRIPTION OF THE PREFERRED EMBODIMENTS

A first embodiment in which the present invention is applied to an electrostatic capacity type semiconductor acceleration sensor will be described hereinafter.

Figure 1:
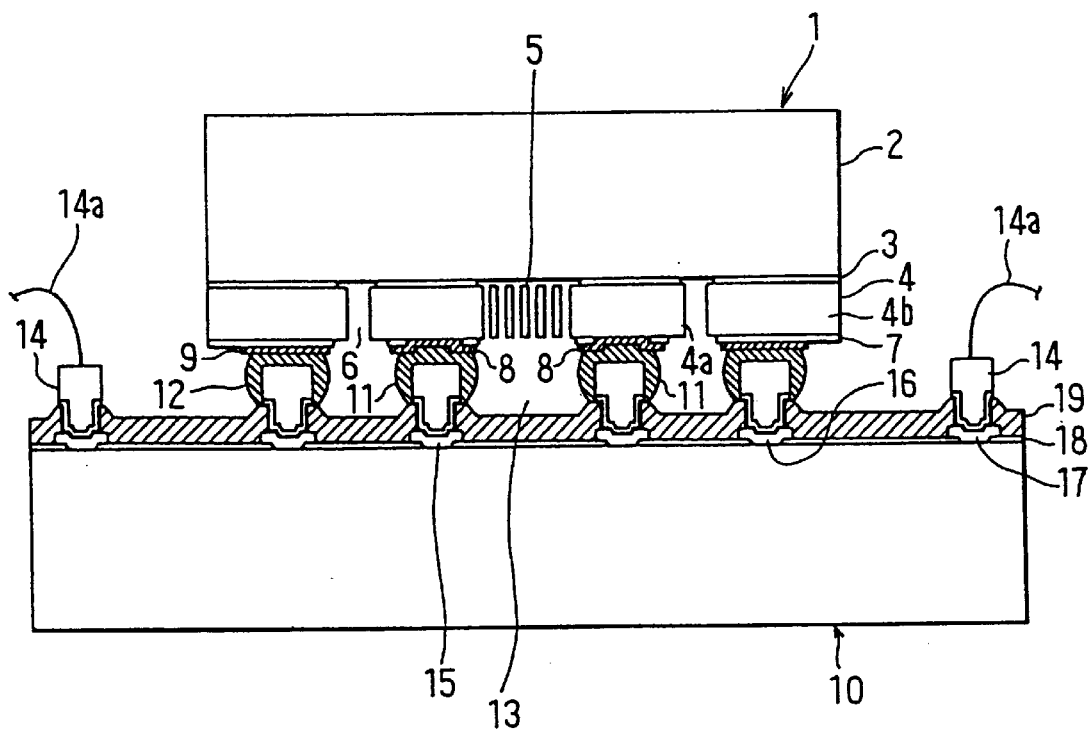
FIG. 1 is a sectional view schematically illustrating a semiconductor acceleration sensor according to a first embodiment of the present invention.
Figure 2:
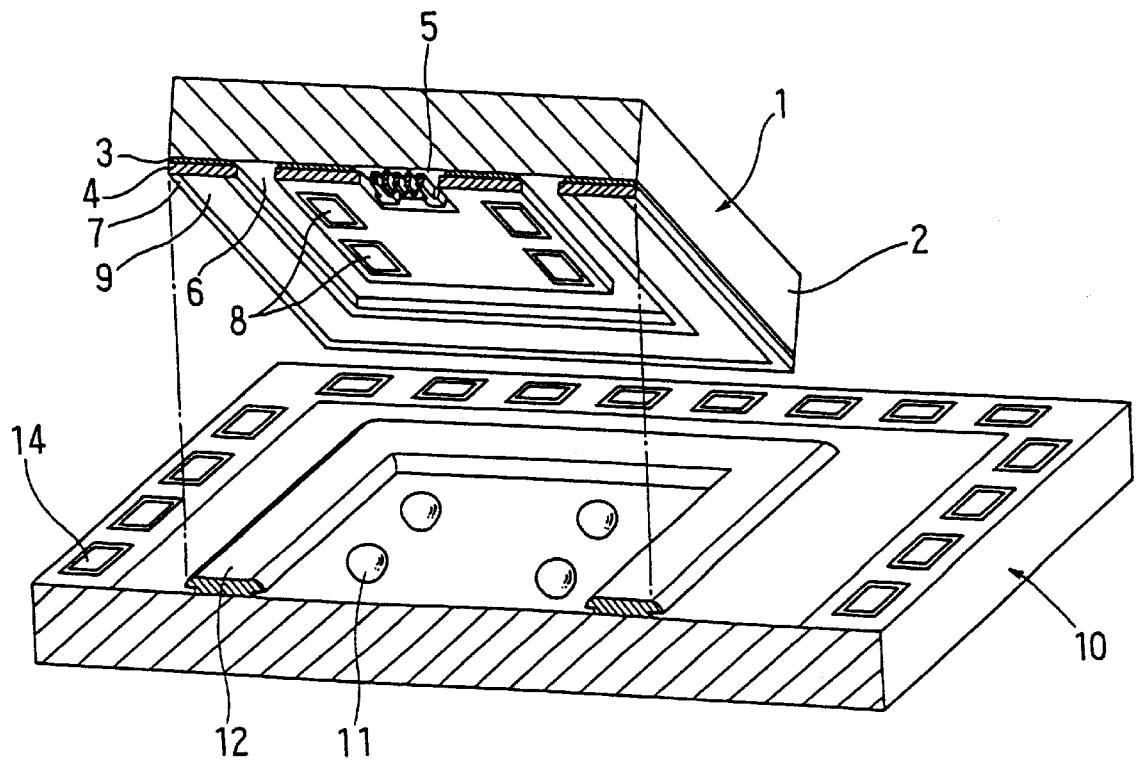
FIG. 2 is a perspective view schematically illustrating a sensor chip and a circuit chip of the semiconductor acceleration sensor.

In FIGS. 1 and 2, a sensor chip 1 of a rectangular shape has an SOI (Silicon On Insulator) structure in which a monocrystalline silicon thin film 4 is formed on one surface (lower surface) of a monocrystalline silicon substrate 2 via an insulating film 3 made of, for example, silicon oxide. A sensing portion 5 is formed by applying a surface micro machining technique to the monocrystalline silicon thin film 4. It is to be noted that the SOI structure as described above can be formed by the so-called lamination method in which a first monocrystalline silicon substrate is laminated on a second monocrystalline silicon substrate on which an insulating film has been formed and is polished to a predetermined thickness. Further, the SOI structure can also be formed by another method as disclosed in, for example, Japanese Patent Application Laid-Open No. H. 5-211128.

The sensing portion 5 comprises a beam structure supported by anchor portions formed on the monocrystalline silicon substrate 2, a movable electrode formed integrally with the beam structure, and a fixed electrode disposed on the monocrystalline silicon substrate 2 with a predetermined gap from the movable electrode, although the detailed structure of the sensing portion 5 is not shown in the figure. Therefore, the displacement of the beam structure in accordance with an acceleration applied thereto is detected as the change of electrostatic capacity between the stationary fixed electrode and the movable electrode which is displaced together with the beam structure. It is to be noted that conductive property is given to the beam structure, movable electrode and fixed electrode by doping an impurity such as phosphorus into monocrystalline silicon of parts constituting them.

A trench 6 is formed in the monocrystalline silicon film 4 so that the monocrystalline silicon film 4 is divided into an inner side thin film portion 4a having a shape of rectangular frame located around the sensing portion 5 and an outer side thin film portion 4b having a shape of rectangular frame located on a periphery of the sensor chip 1. Insulating films 7 made of, for example, silicon oxide are formed on upper surfaces of the inner side thin film portion 4a and the outer side thin film portion 4b.

Plural electrode pads 8 electrically connected to the sensing portion (particularly, the movable electrode and the fixed electrode) are formed on the inner side thin film portion 4a. In this case, electrical conduction between the electrode pads 8 and the sensing portion 5 is ensured through an opening portion formed in the insulating film 7, an impurity doped region formed in the inner side thin film portion 4a by doping an impurity such as phosphorus thereinto, an opening portion formed in the insulating film 3, and an impurity doped region formed in the monocrystalline silicon substrate 2 by doping the impurity such as phosphorus thereinto. A joining pad 9 having a shape of rectangular frame is formed on the outer side thin film portion 4b. The joining pad 9 is electrically insulated from the sensing portion 5 by the insulating film 7. It is to be noted that, as apparent from the later description, each of the electrode pad 8 and the joining pad 9 has a three-layer structure in which a Ti-layer, Ni-layer and Au-layer are laminated in this order.

In the above-described structure, to make use of characteristics of the SOI structure, the insulating film 3 is left as it is, the sensing portion 5 is preferably formed on the insulating film 3. Further, a conductive film (for example, impurity doped polycrystalline silicon) is preferably formed on the insulating film 3 to electrically connect the electrode pads 8 and sensing portion 5.

The sensor chip 1 is connected to the circuit chip 10 by a connecting step using thermo-compression bonding. Specifically, bump electrodes 11 made of solder material (for example, Sn(40%)-Pb solder) and a sealing bump 12 having a shape of a rectangular frame are formed on the circuit chip 10 at positions corresponding to the electrode pads 8 and the joining pad 9 formed on the sensor chip 1, respectively. The thermo-compression bonding is carried out in a state in which the electrode pads 8 and the joining pad 9 on the sensor chip 1 are made contact with the bump electrodes 11 and the sealing bump 12 on the circuit chip 10, respectively. As a result, the sensor chip 1 is connected to and mounted on the circuit chip 10.

Therefore, when the sensor chip 1 is mounted on the circuit chip 10, an air-tight space 13 in which the sensing portion is contained is formed by the sealing bump 12 and the joining pad 9 interposed between the sensor chip 1 and the circuit chip 10.

The circuit chip 10 is formed from a monocrystalline silicon substrate. Integrated circuit elements (transistors, diodes, resistors and so on) are formed on the circuit chip 10 in a region outside the sealing bump 12 to form a processing circuit for a sensor output from the sensing portion 5. Further, a plurality of electrodes 14 for bonding use is formed at the most periphery portion of the circuit chip 10. Each electrode 14 is made of copper. It is to be noted that the processing circuit and the bump electrodes 11 are electrically connected via conductive regions formed to be embedded in the circuit chip 10.

Figure 12:
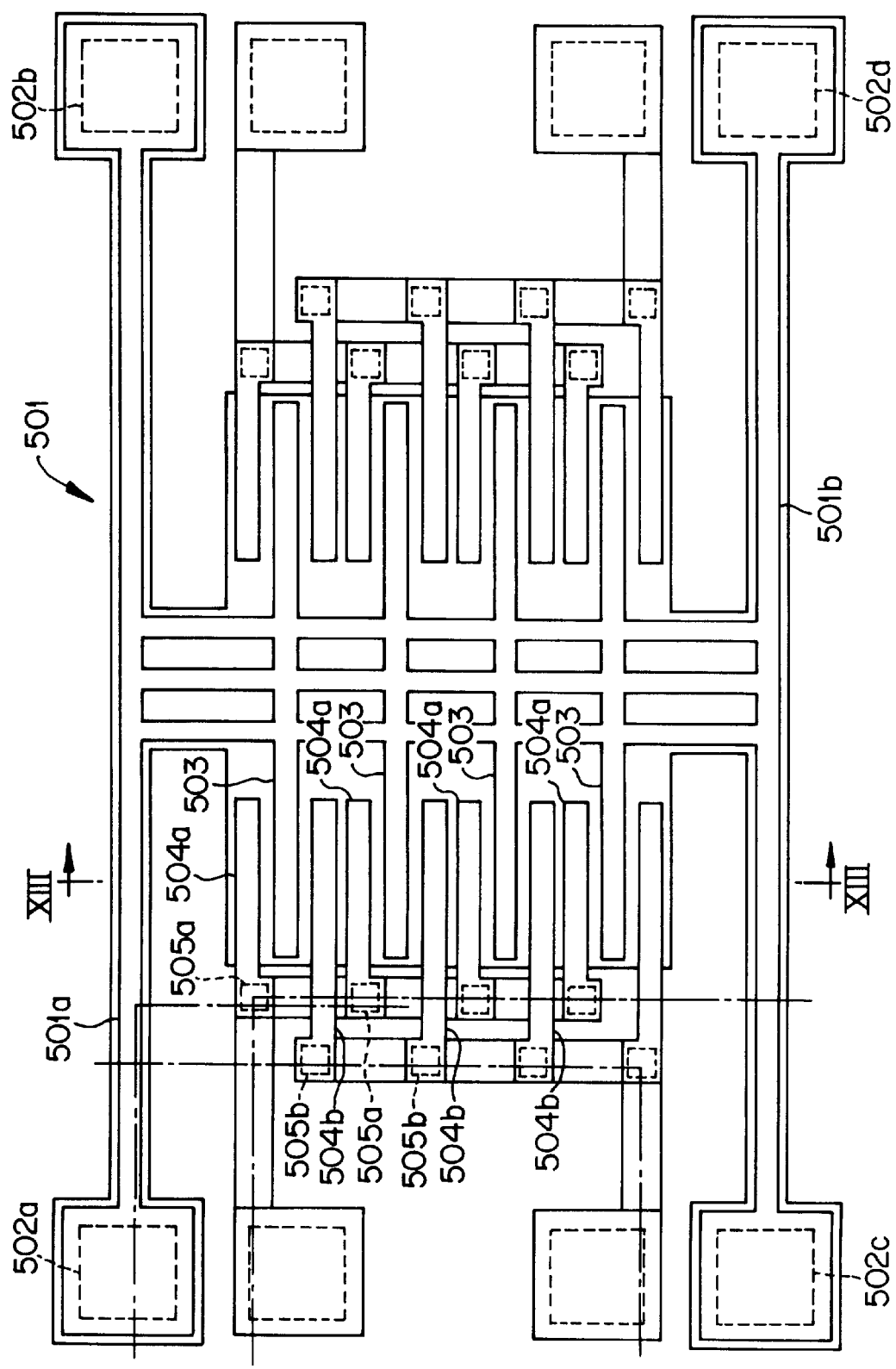
FIG. 12 is a plain view showing a sensing portion.
Figure 13:
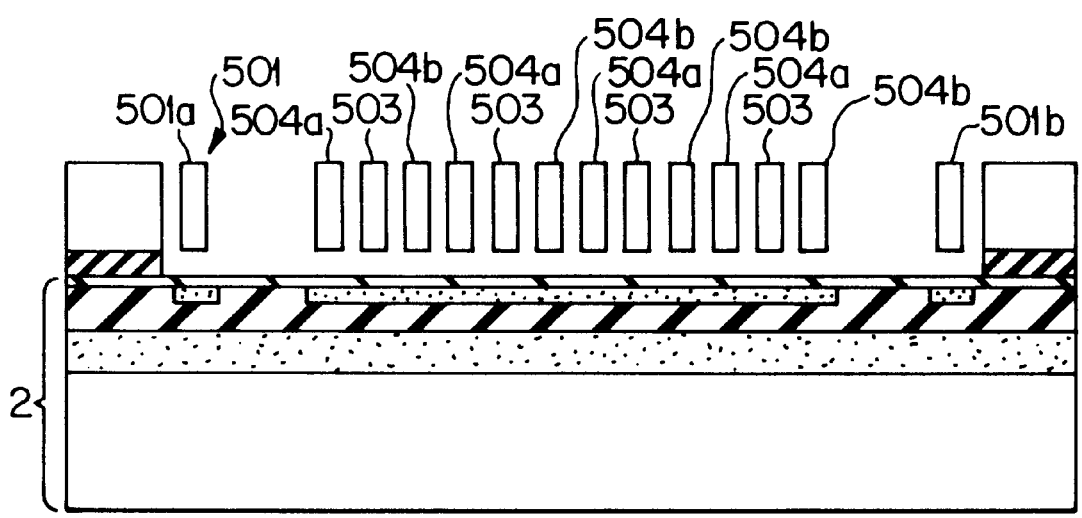
FIG. 13 is a cross-sectional view taken along the line XIII—XIII in FIG. 12.

Also, on the circuit chip 10, aluminum electrodes 15, 16 and 17 are formed corresponding to the bump electrodes 11, the sealing bump 12 and the electrodes 14 for bonding use, respectively, as shown in FIG. 1. Further, an insulating film 18 made of, for example, silicon oxide or BPSG and a passivation film 19 made of silicon oxide or silicon nitride are formed on the circuit chip 10, as shown in FIG. 1. As shown in FIGS. 12 and 13, the sensing portion has a beam structure 501,which is supported by anchor portions 502a–502d formed on the substrate 2. The beam structure 501 includes two beams 501a, 501b respectively provided between the anchor portions 502a and 502b, and 502c and 502d. The beams structure 501 is integrally formed with movable electrodes 503. Two groups of fixed electrodes 504a and 504b are disposed on the substrate 2 with a predetermined gap from the respective movable electrodes 503. The displacement of the beam 501 in accordance with an acceleration applied thereto is detected as changes of electrostatic capacities between the respective fixed electrodes 504a, 504b and the movable electrodes 503 which are displaced together with the beam structure 501.

Next, the manufacturing process of the circuit chip 10 will be described with reference to FIGS. 3A through 5C.

Figure 3A:
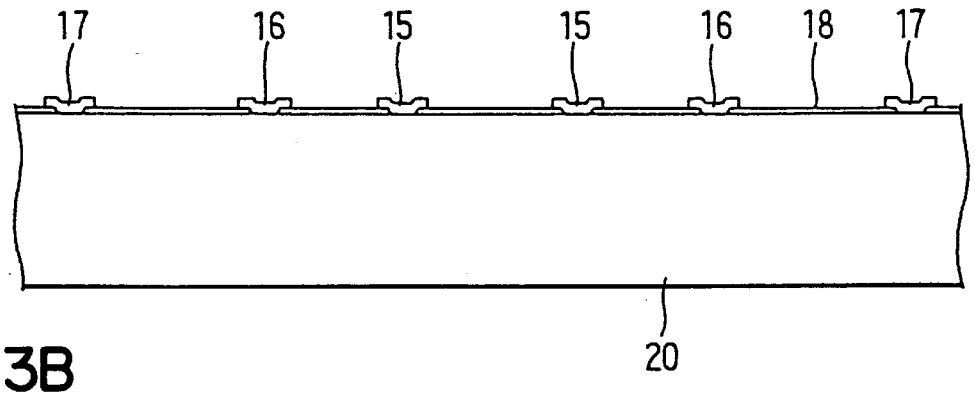
FIGS. 3A to 3C through FIGS. 5A to 5C are sectional views illustrating a manufacturing process of the circuit chip in a stepwise manner.
Figure 3B:
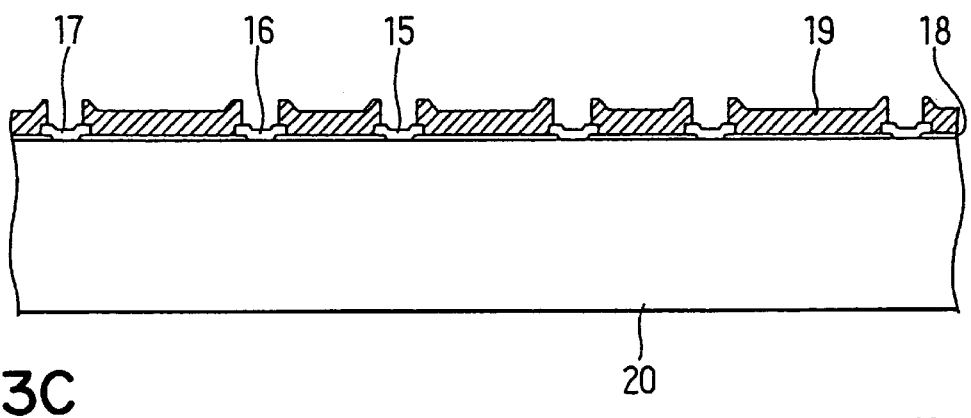

FIG. 3A shows a part of a monocrystalline silicon wafer 20 on which the aluminum electrodes 15, 16 and 17, the insulating film 18, and the integrated circuit elements for the processing circuit (not shown) are formed by a normal LSI manufacturing process. To produce the circuit chip 10 from the monocrystalline silicon wafer 20, first, a film formation step is carried out. In the film formation step, the passivation film 19 is formed on the entire surface of the wafer 20 by plasma CVD method or the like. Thereafter, an opening step is carried out. In the opening step, as shown in FIG. 3B, openings are formed in the passivation film 19 at positions corresponding to the aluminum electrodes 15, 16 and 17 by etching.

Figure 3C:
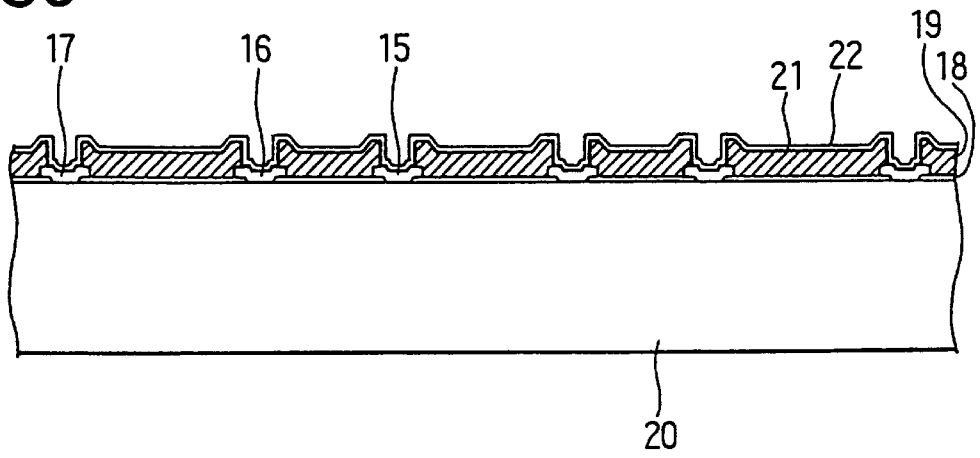

Following this, a pretreatment step is carried out. In the pretreatment step, as shown in FIG. 3C, a Ti-layer 21 which is bonded with the aluminum electrodes 15, 16 and 17 and the passivation film 19 is vapor-deposited to a thickness of about 300 nm, after that, a Cu-layer 22 to become an underlying layer for Cu plating is successively vapor-deposited to a thickness of about 1 μm. It is to be noted that a TiN-layer or TiN/Ti-layer may be formed instead of the Ti-layer 21.

Figure 4A:
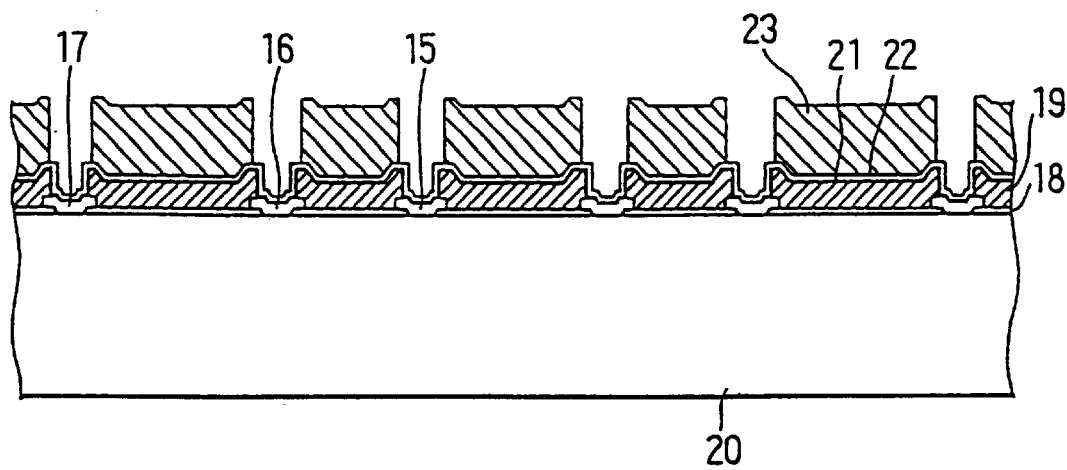

Next, a photo-lithography step is carried out as shown in FIG. 4A. In this step, after a photo resist 23 of a thickness of about 25 μm (for example, of posi-type) is applied on the Cu-layer 22, parts corresponding to formation regions of the bump electrodes 11, sealing bump 12 and the electrodes 14 for bonding use are exposed to light and removed by development.

Figure 4B:
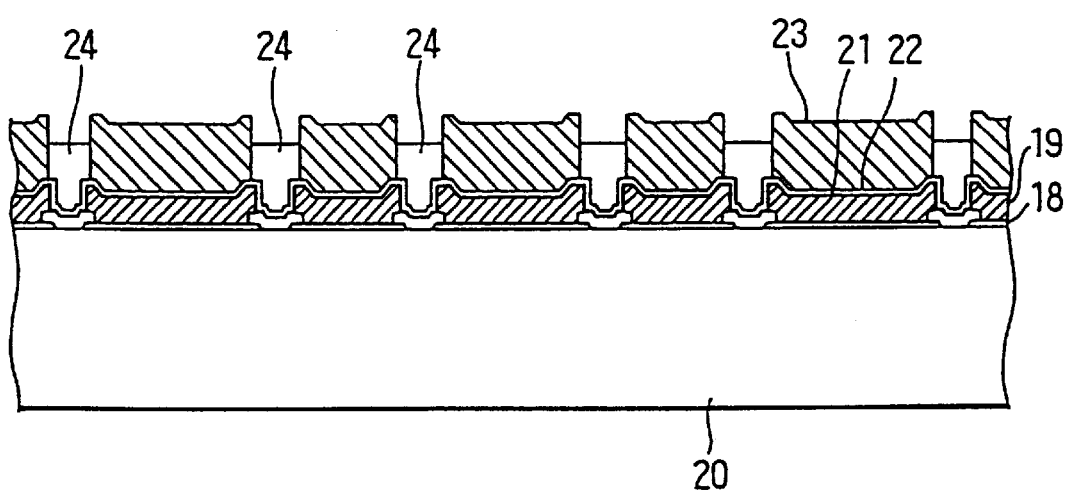
Figure 4C:
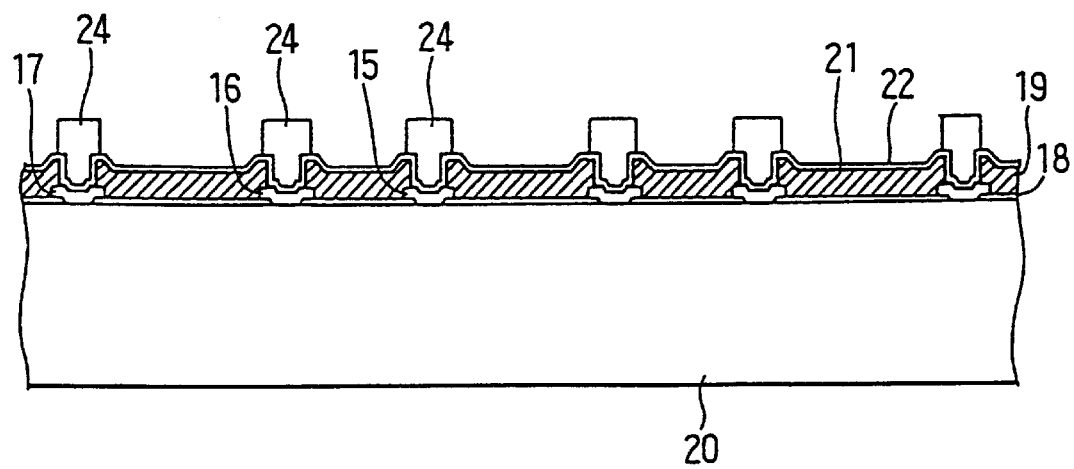
Figure 5A:
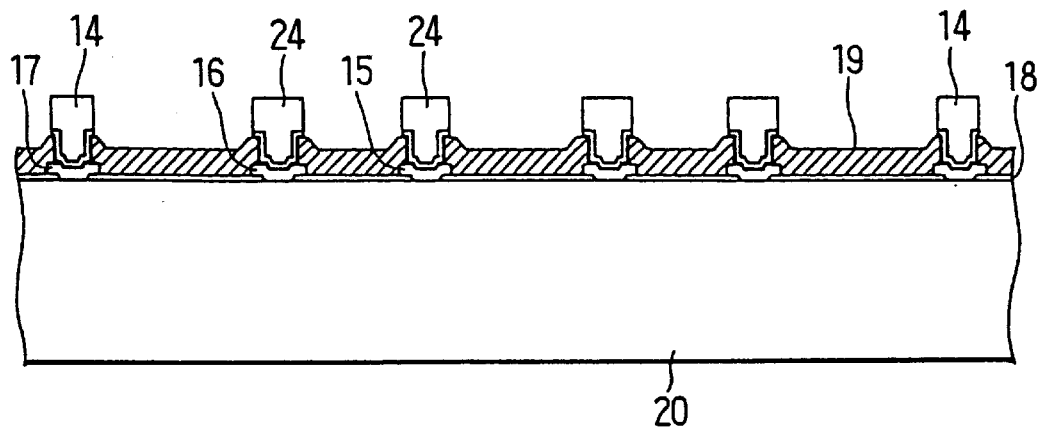

Next, in a plating step as shown in FIG. 4B, Cu-bumps 24 are formed on the Cu-layer 22 through the openings formed by the photo-lithography step by an electrolytic plating method. Further, in a resist removing step as shown in FIG. 4C, the photo resist 23 is removed by a resist release solution. Sequentially, in an etching step as shown in FIG. 5A, the Cu-layer 22 and the Ti-layer 21 are etched and removed with the Cu bumps 24 as an etching mask. As a result, the Cu bumps corresponding to the aluminum electrodes 17 are formed and serve as the electrodes 14 for bonding use.

Figure 5B:
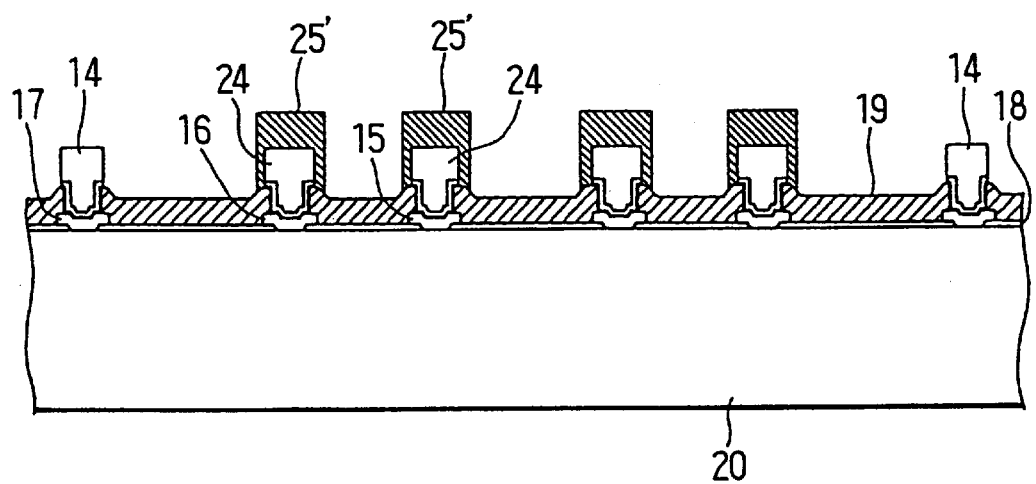
Figure 5C:
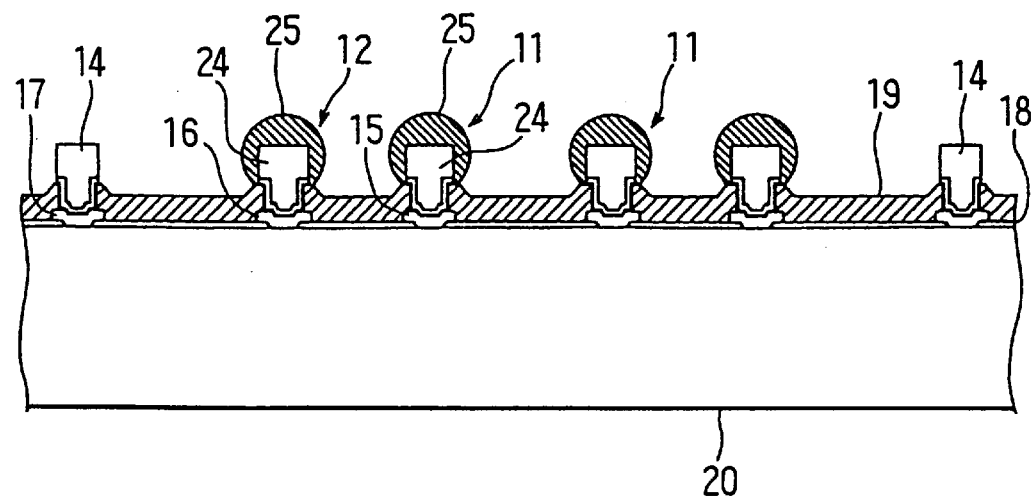

After that, a bump forming step as shown in FIGS. 5B, 5C is carried out. In this step, solder bumps 25' of a straight wall shape are formed by screen-printing a paste of eutectic solder composed of Sn—Pb (for example, Sn(40%)-Pb solder) on the Cu-bumps 24 corresponding to the aluminum electrodes 15, 16. Next, by carrying out annealing in a reducing atmosphere, the solder bumps 25' are transformed to solder bumps 25 having a shape of mushroom as shown in FIG. 5C, whereby the bump electrodes 11 and the sealing bump 12 are formed.

Finally, the monocrystalline silicon wafer 20 after the steps as described above is diced, thereby completing the circuit chip 10 on which the processing circuit (not shown), bump electrodes 11 and sealing bump 12 are formed.

It is to be noted that a series of steps (film formation step, opening step, pretreatment step, photo-lithography step, plating step, resist removing step, and bump forming step) as described above corresponds to an electrode and sealing member forming step.

The manufacturing process of the sensor chip 1 will be described hereinafter with reference to FIGS. 6A through 10.

Figure 6A:
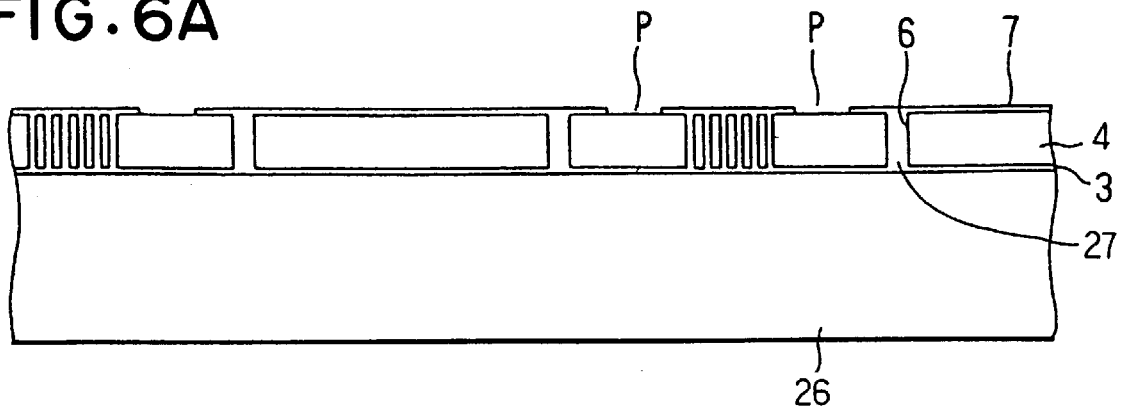
FIGS. 6A to 6C through FIG. 10 are sectional views illustrating a manufacturing process of the sensor chip in a stepwise manner.
Figure 6B:
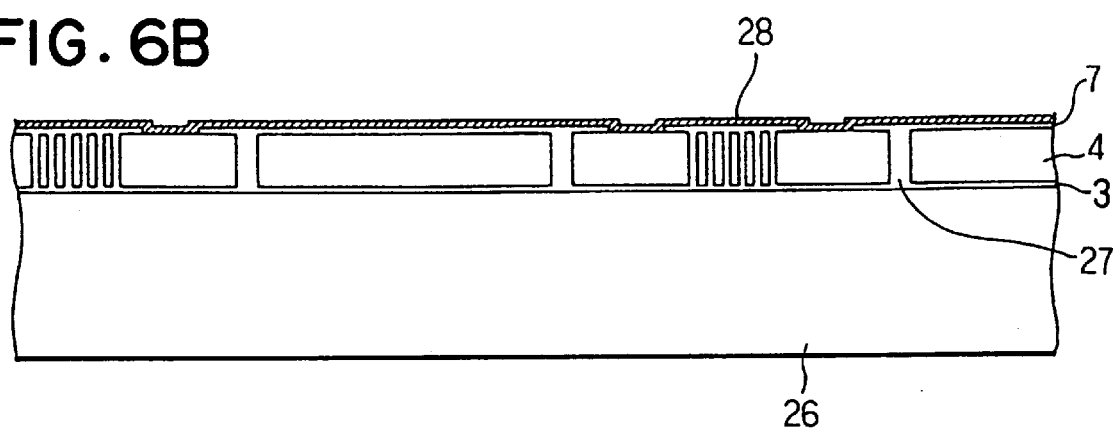

On a monocrystalline silicon 26 partially shown in FIG. 6A, the insulating film 3, monocrystalline silicon thin film 4 (including portions corresponding to the inner side thin film portion 4a,outer side thin film portion 4b,and the sensing portion 5) and insulting film 7 are formed by a normal semiconductor manufacturing process. Further, a sacrifice layer 27 made of silicon oxide is formed to fill a space (a trench 6 formed around the inner side thin film portion 4a) between the insulating films 3 and 7 made of silicon oxide. Openings are formed in the insulating film 7 at formation regions P of the electrode pads 8 by an etching step. It is to be noted that an impurity such as phosphorus is doped in required parts of the monocrystalline silicon wafer 26 and the monocrystalline silicon thin film 4. To produce the sensor chip 1 from the monocrystalline silicon wafer 26 as described above, first, in a film formation step as shown in FIG. 6B, an electrode film 28 which finally becomes electrode pads 8 and the joining pad 9 is formed on the insulating film 7 and on the monocrystalline silicon thin film 4 at the formation regions P. In this case, the electrode film 28 is a three-layer vapor-deposition film of Au/Ni/Ti to enable the electrode pads 8 and the sealing pad 9 to be respectively bonded with the bump electrodes 11 and the sealing bump 12 composed of Sn(40%)-Pb solder without using flux.

That is, although the detailed structure of the electrode film 28 is not shown in the figure, the electrode film 28 is formed by vapor-depositing the Ti-layer bonded to the monocrystalline silicon thin film 4 and the insulating film 7 by a thickness of about 100 nm, then by vapor-depositing, on the Ti-layer, the Ni-layer which is a metallic material for forming a metallic compound with the Sn—Pb solder by a thickness of about 700 nm, and further by vapor-depositing, on the Ni-layer, the Au-layer to prevent oxidation of the Ni-layer by a thickness of about 20 nm. It is to be noted that the vapor depositions of the respective layers as described above are successively carried out in a vacuum atmosphere.

Figure 6C:
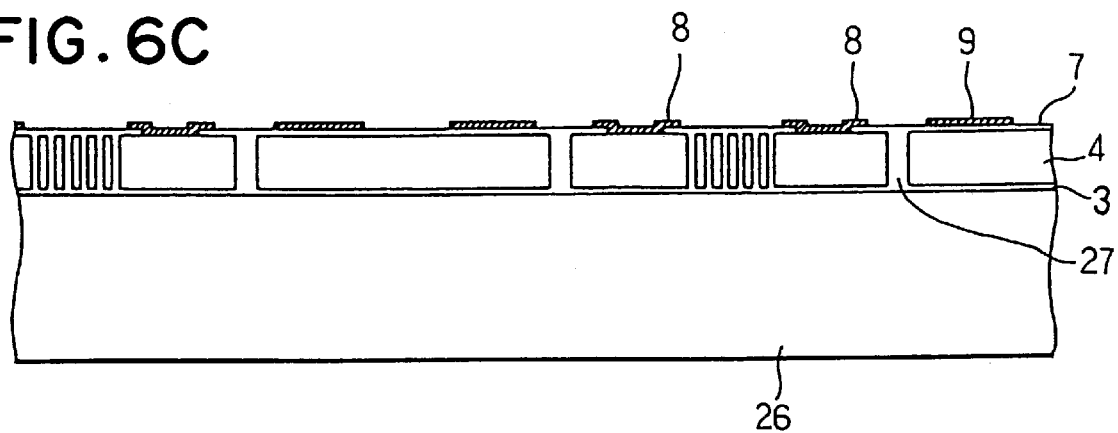

Next, an etching step is carried out as shown in FIG. 6C. In this etching step, the electrode film 28 is removed by etching while parts thereof corresponding to the electrode pads 8 and the joining pad 9 are left. Thereby, the electrode pads 8 and the joining pad 9 are formed. In this case, as etchants for the respective layers of the electrode film 28, a mixed solution of $NH_4I$, $I_2$, $H_2O$ can be used for the Au-layer, a mixed solution of $HNO_3$, $H_3PO_4$, $CH_3COOH$, $H_2O$ for the Ni-layer, and a diluted HF solution for the Ti-layer.

Figure 7A:
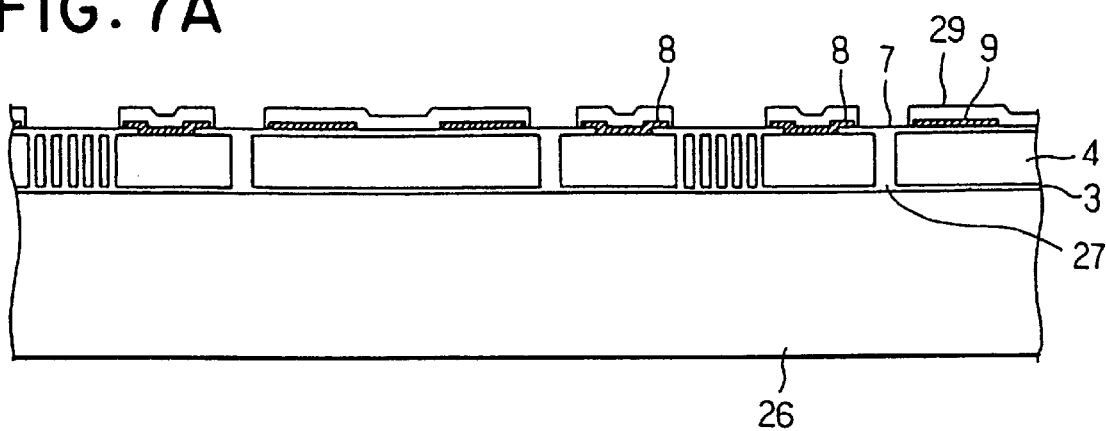

After that, a photo-lithography step as shown in FIG. 7A is carried out. In the photo-lithography step, after a photo resist 29 of a thickness of a few micro-meters (for example, of posi-type) is applied on the electrode pads 8 and the joining pad 9, only the regions corresponding to the sacrifice layers 27 are exposed to light and removed by development. As a result, the electrode pads 8 and the joining pad 9 remain covered by the photo resist 29. It is to be noted that an acid proof resist (for example, rubber resist) may be used as the photo resist, in correspondence with a time period of carrying out an etching step for the sacrifice layer 27, which is to follow the photo-lithography step.

Figure 7B:
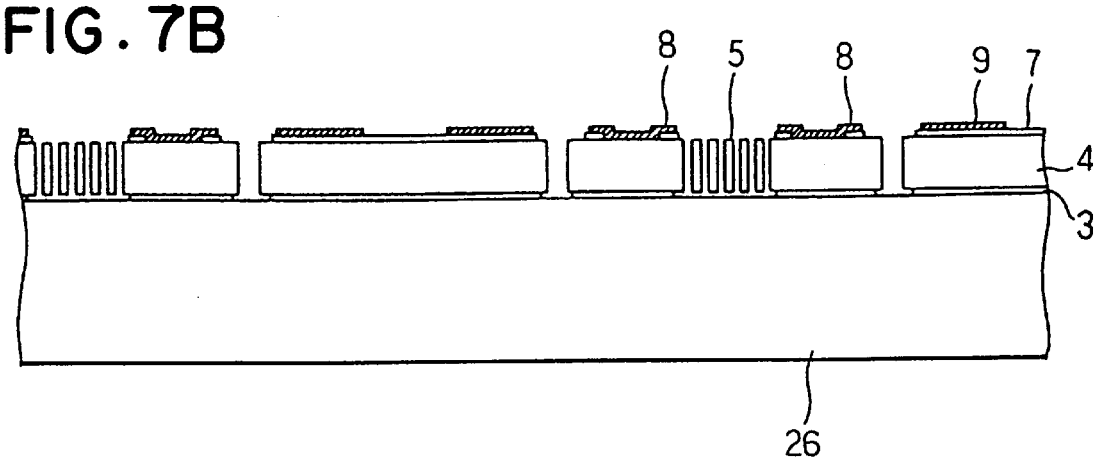

Next, in a sacrifice layer etching step shown in FIG. 7B, the insulating film 7, the sacrifice layer 27 and the insulating film 3, all of which are composed of silicon oxide, are wet-etched by an HF etching solution. After that, the photo resist 29 is removed. As a result, the sensing portion 5 is formed. It is to be noted that doping of the impurity such as phosphorus can be carried out in this stage.

Finally, the monocrystalline silicon wafer 26 after the steps as described above is diced, thereby completing the sensor chip 1 on which the sensing portion 5, electrode pads 8 and joining pad 9 are formed. However, if normal dicing is carried out, the sensing portion 5 sustains damage from cooling water used in the dicing step. Therefore, the dicing step is carried out by the procedure as described below.

Figure 7C:
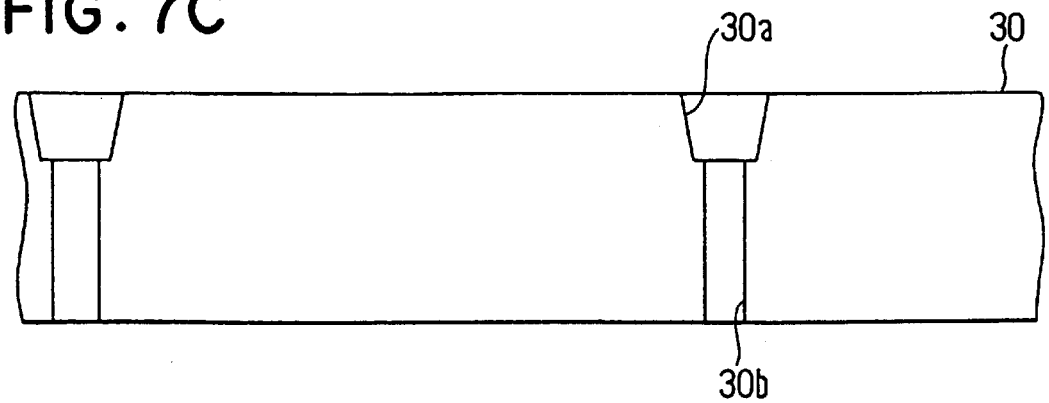

First, as shown in FIG. 7C, a machinable ceramic substrate 30 is prepared. The machinable ceramic substrate 30 has a size capable of mounting the monocrystalline silicon wafer 26 thereon. Grooves 30a are formed in the ceramic substrate 30 at positions corresponding to the sensing portion 5 to avoid mechanical contact with the sensing portion 5. Further, through holes 30b are formed from a bottom of each groove 30a to evacuate the grooves 30a to a vacuum. Working for forming the grooves 30a and the through holes 30b can be carried out using a drill.

Figure 8A:
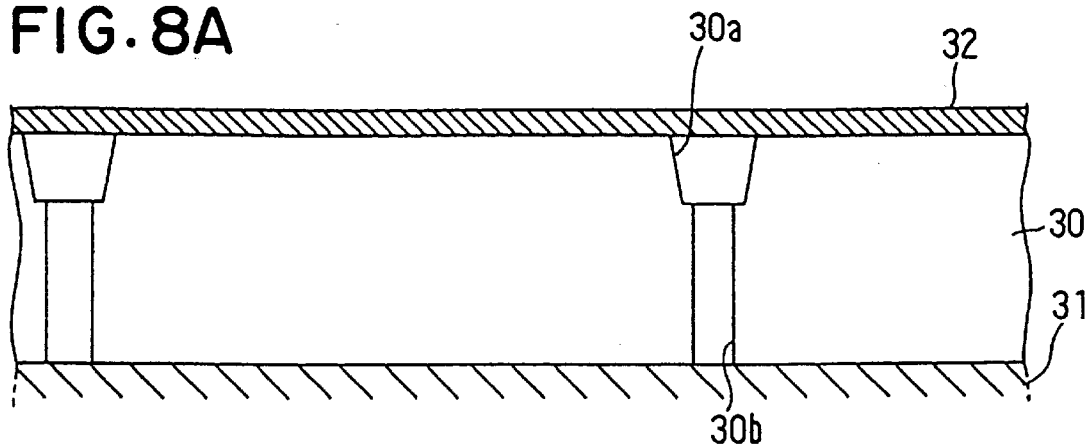
Figure 8B:
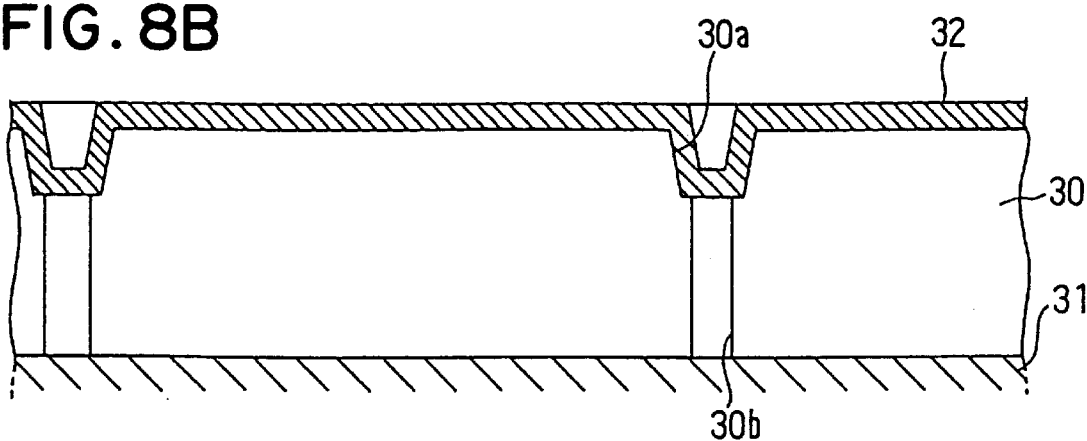

Next, as shown in FIG. 8A, the ceramic substrate 30 is set on a vacuum chuck stage 31, whereby the ceramic substrate 30 is brought into a state of enabling evacuation of the grooves 30a via the through holes 30b. In this state, the ceramic substrate 30 is heated up to about 70° C., and an adhesive sheet 32 of ultraviolet ray curing type, on one side surface of which an adhesive compound is coated, is placed on the ceramic substrate 30 while the adhesive compound coated surface of the adhesive sheet 32 faces upward. As a result, the adhesive sheet 32 is deformed along the surface of the groove 30a of the ceramic substrate 30, as shown in FIG. 8B.

Figure 8C:
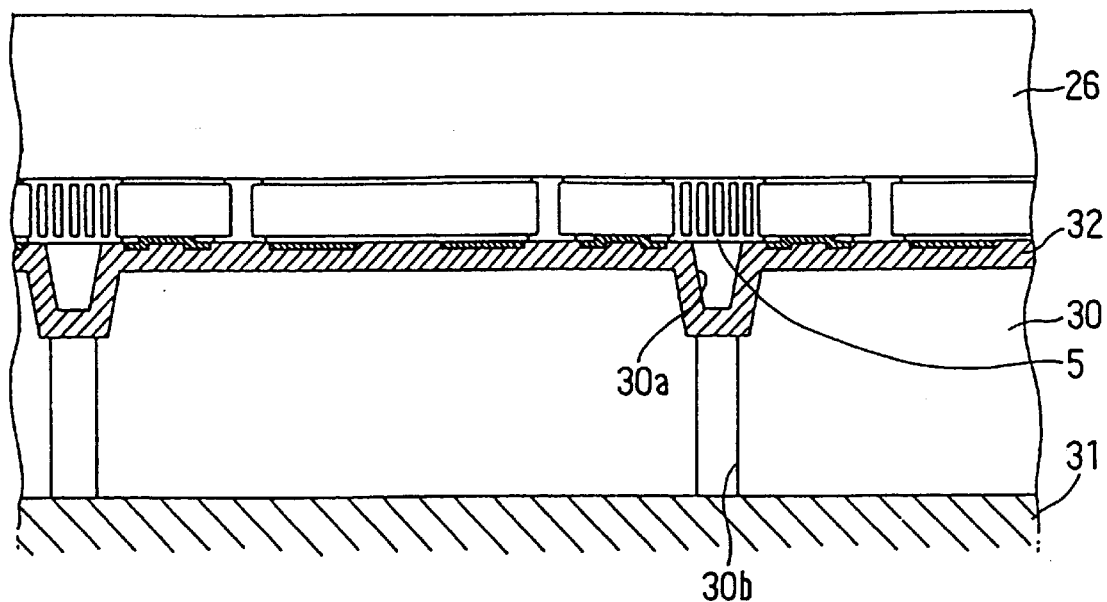

After that, as shown in FIG. 8C, the monocrystalline silicon wafer 26 to be diced is placed on (adhered onto) the upper surface (adhesive compound coated surface) of the adhesive sheet 32. At this time, the surface of the silicon wafer 26 on which the sensing portions 5 are formed faces downward, and the sensing portion 5 are positioned corresponding to the grooves 30a of the ceramic substrate 30. After that, the ceramic substrate 30 and the adhesive sheet 32 are cooled down to a room temperature.

Figure 9A:
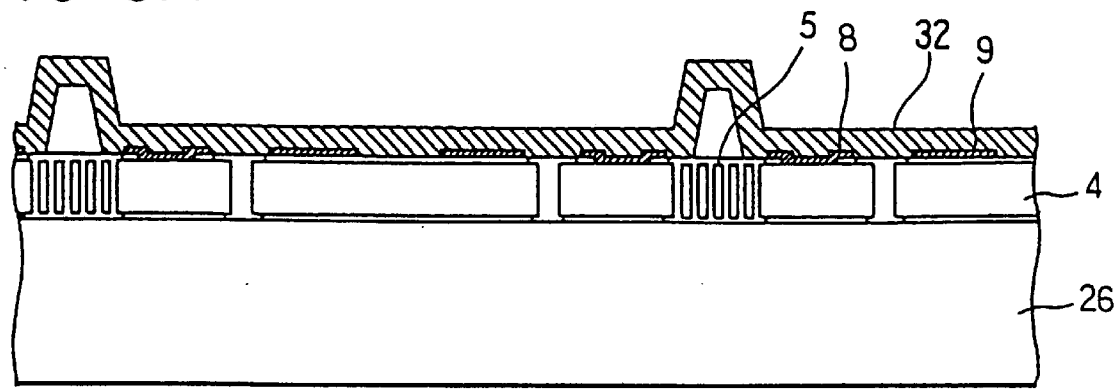
Figure 9B:
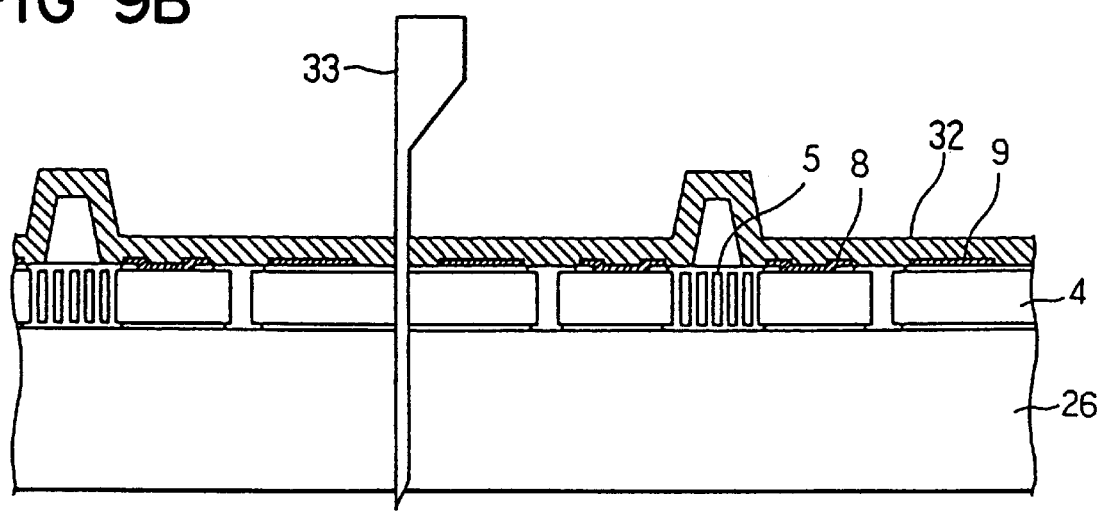

Following this, the vacuum chuck stage 31 stops the operation for evacuating the grooves 30a to a vacuum. Then, as shown in FIG. 9A, the monocrystalline silicon wafer 26 and the adhesive sheet which are adhered to each other, are detached from the ceramic substrate 30. As shown in FIG. 9B, the monocrystalline silicon wafer 26 is diced at predetermined positions by a dicing saw in a state that the adhesive sheet is being adhered thereto. Because the sensing portion 5 is protected by the adhesive sheet 32 when the silicon wafer 26 is diced, it is possible to prevent the sensing portion 5 from sustaining damage from cooling water used in the dicing step.

Figure 9C:
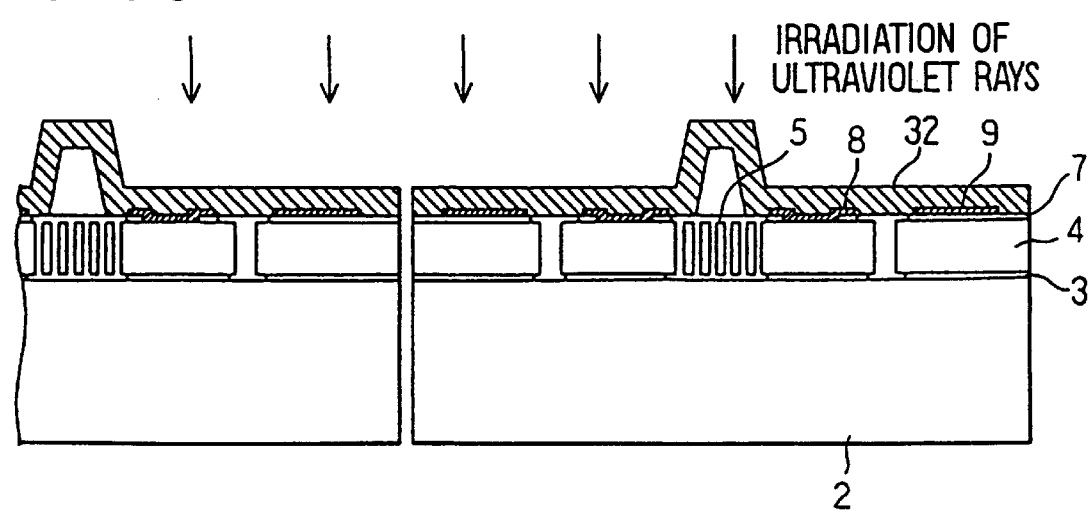
Figure 10:
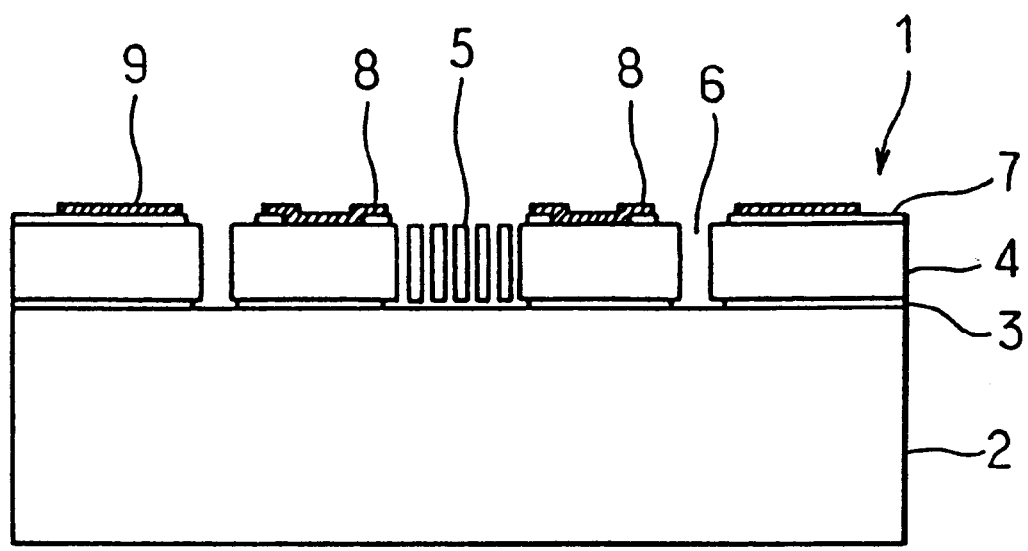

After the silicon wafer 26 is diced, as shown in FIG. 9C, ultraviolet rays are irradiated onto the ultraviolet ray curing type adhesive sheet 32. As a result, the adhesive sheet 32 is cured and its adhesive strength is reduced. After that, the adhesive sheet 32 is removed from the silicon wafer 26, thereby completing the sensor chip 1 as shown in FIG. 10.

The sensor chip 1 thus completed is connected to the circuit chip 10 by the connecting step using thermo-compression bonding. In detail, the sensor chip 1 is heated up to about 180° C. which is higher than a temperature of the Sn(40%)-Pb solder melting in an inert atmosphere or in a reducing atmosphere. In the heated state, the electrode pads 8 and the sealing pad 9 of the sensor chip 1 are made contact with the bump electrodes 11 and the sealing bump 12 of the circuit chip 10, respectively. Further, the sensor chip 1 is pressed on the circuit chip 10 from the state that the sensor chip 1 contacts the circuit chip 10. In this manner, the sensor chip 1 and the circuit chip 10 are connected by the thermo-compression bonding.

In the thermo-compression bonding, Sn included in the bump electrodes 11 and the sealing bump 12 and Ni included in the electrode pads 8 and the joining pad 9 form a metallic compound, thereby increasing bonding strength therebetween. It is to be noted that, in the thermo-compression bonding, the circuit chip 10 may be heated, or both the sensor chip 1 and the circuit chip 10 may be heated simultaneously.

After the thermo-compression bonding, the electrodes 14 for bonding use are connected with a lead frame (not shown) by wire-bonding. In this case, because one end of a wire 14a is bonded to the electrode 14 made of copper and formed at the most peripheral portion of the circuit chip 10, oxidation of the electrode 14 must be prevented. For this reason, the wire-bonding is carried out in the inert atmosphere or in the reducing atmosphere. After the wire-bonding, resin molding is carried out with respect to the sensor chip 1 and the circuit chip 10 connected integrally, thereby packaging them. Thereafter, the semiconductor acceleration sensor is completed by cutting the lead frame and the like.

According to the embodiment described above, the following advantages can be obtained.

Because the sensor chip 1 and the circuit chip 10 are arranged in the so-called COC (chip on chip) structure, the chip size of the semiconductor acceleration sensor is prevented from enlarging in two-dimension. Further, the sensor chip 1 functions as a protecting cap against the molding resin. Consequently, the size of the semiconductor acceleration sensor can be miniaturized as a whole.

Also, since the chip size of each of the sensor chip 1 and the circuit chip 10 can be made small, the number of chips obtained from a single wafer can be increased. Further, since the sensor chip 1 and the circuit chip 10 are formed separately to each other, the number of steps in manufacturing process performed with respect to each of chips can be reduced and the yield factor of each chip can be enhanced. Accordingly, the manufacturing cost of the semiconductor acceleration sensor can be decreased. Furthermore, because the air-tight space 13 containing the sensing portion 5 is formed by the sealing bump 12, even when a resin-molded package of low cost is used to house the semiconductor acceleration sensor, the sensing portion 5 does not receive adverse influence from the molding resin. In view of this aspect also, the reduction of the manufacturing cost can be promoted.

Electrical connection between the sensor chip 1 and the circuit chip 10 can be reliably ensured by the bump electrodes 11 and the electrode pads 8. Further, the sealing bump 12 can prevent liquid from invading into the air-tight space 13 in which the sensing portion 5 is located. Therefore, the reliability of operation in the semiconductor acceleration sensor can be enhanced.

To form the COC structure, the bump electrodes 11 and the sealing bump 12 are formed on the circuit chip 10 in advance, and the electrode pads 8 and the joining pad 9, which are to be bonded to the bump electrodes 11 and the sealing bump 12 respectively, are formed on the sensor chip 1 in advance. Therefore, the COC structure is completed simply by connecting the sensor chip 1 onto the circuit chip 10.

In this case, the bump electrodes 11 and the sealing bump 12 are made of the same material (Sn—Pb solder material), and the electrode pads 8 and the joining pad 9 are also formed by the same material (three-layer vapor-deposition film of Au/Ni/Ti). In addition, the bump electrodes 11 and the sealing bump 12 are formed in the same step, and the electrode pads 8 and the joining pad 9 are also formed in the same step. Therefore, the number of steps required to form them can be decreased, thereby reducing the manufacturing cost of the semiconductor acceleration sensor.

Because the bump electrodes 11 and the sealing bump 12 are formed on the circuit chip 10, the step of forming them can be simply carried out. If the bump electrodes 11 and the sealing bump 12 are formed on the sensor chip 1, the sensing portion 5 may be broken by squeegee scanning upon screen-printing the paste of eutectic solder, or plating solution for Cu plating on the Cu bump 24 may provide adverse influence to the sensing portion 5. Therefore, any countermeasure must be taken against that problems, whereby the step of forming the bump electrodes 11 and the sealing bump 12 becomes complicated. To contrary, when the bump electrodes 11 and the sealing bump 12 are formed on the circuit chip 10, the above-described countermeasure is not necessary. As a result, the step of forming the bump electrodes 11 and the sealing bump 12 can be made simple.

The present invention is not limited to the above-described embodiment, but can be modified or extended within its spirit and scope as set out in the accompanying claims.

For example, it is possible to form at least one of the bump electrodes 11 and the sealing bump 12 on the sensor chip 1. In this case, however, any countermeasure is required to prevent the sensing portion 5 from receiving the adverse influence in forming the bump electrodes 11 and the sealing bump 12. In connection thereto, there may be carried out an electrode forming step in which bump electrodes are formed on either one of the surface of the sensor chip 1 on the side of the sensing portion 5 and an upper side of the circuit chip 10, and electrode pads to be bonded to the bump electrodes are formed on the other thereof, and a sealing member forming step in which a sealing bump (sealing member) having a shape of a rectangular frame is formed on either one of the surface of the sensor chip 1 on the side of the sensing portion 5 and an upper side of the circuit chip 10 to form an air-tight space containing the sensing portion 5, and a joining pad having the same shape as the sealing bump is formed on the other thereof to be bonded to the sealing bump.

The material of the sealing bump 12 is not limited to Sn—Pb solder, the other soft solder material or an inorganic material having adhesiveness can be used instead. Also, the material of the electrode pad 8 and the joining pad 9 is not limited to that described in the embodiment.

Although the embodiment in which the present invention is applied to the electrostatic capacity type semiconductor acceleration sensor and the manufacturing method thereof is described, the present invention can be widely applied to a semiconductor device provided with a structure which is displaced in accordance with physical quantity applied thereto such as a sensor detecting the physical quantity such as yaw rate, vibration, angular velocity, and pressure, including a piezo resistance type semiconductor acceleration sensor.

Figure 11:
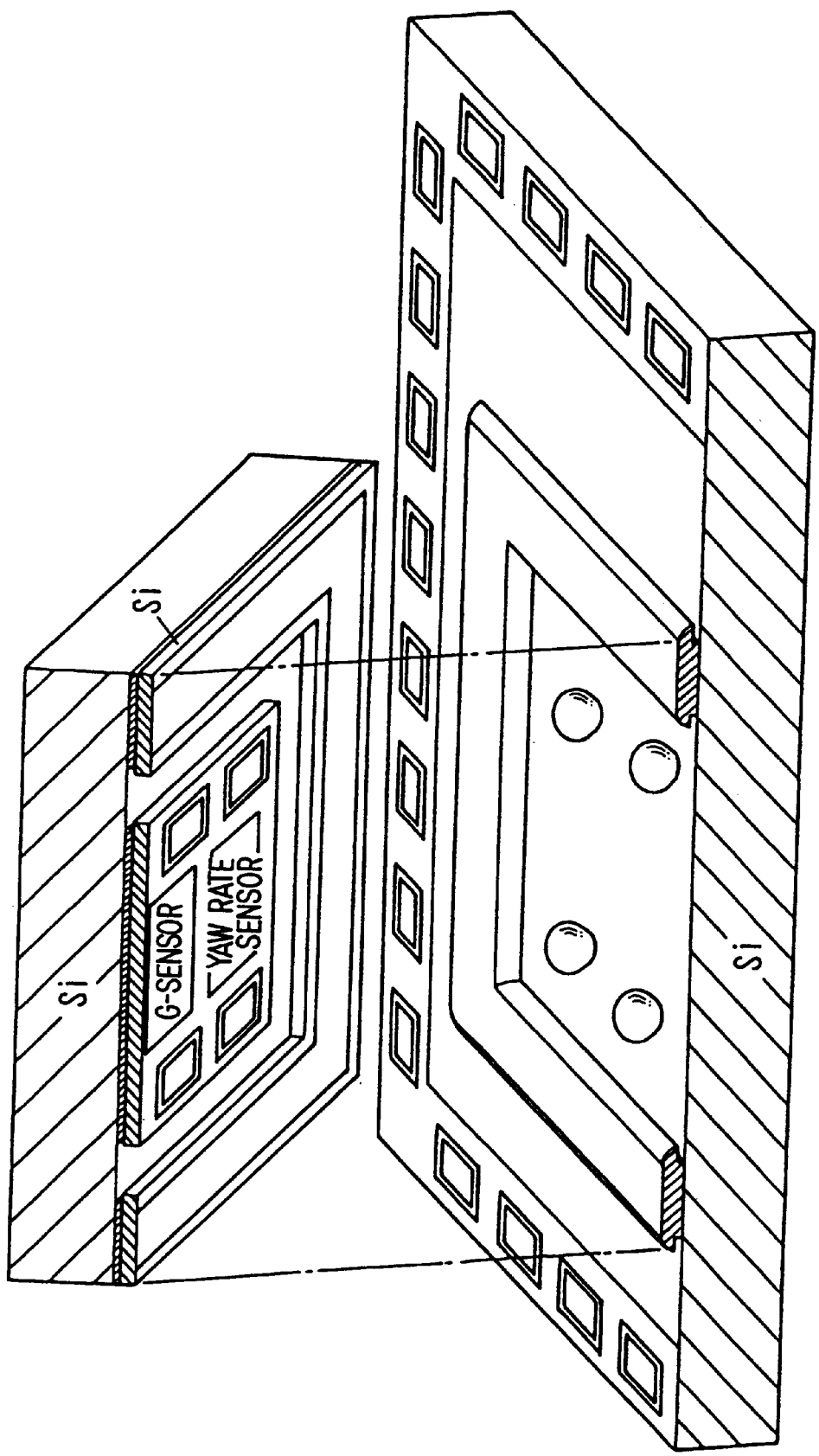
FIG. 11 is a perspective view schematically illustrating a sensor chip and a circuit chip according to a modification of the first embodiment.

Further, as shown in FIG. 11, different types of sensors such as an acceleration sensor and a yaw rate sensor may be formed together in a single chip.

What is claimed is:

1. A semiconductor device comprising:
   a sensor chip including a semiconductor substrate having a main surface on which is formed a sensing portion that is movable in a direction approximately parallel to said main surface of said semiconductor substrate;
   a circuit chip made of semiconductor material, in which a processing circuit for an output from said sensing portion is formed;
   a first bump electrode electrically connected to said sensing portion and said processing circuit, wherein said sensor chip is connected onto said circuit chip with said first bump electrode being interposed therebetween;
   a second bump electrode disposed on said circuit chip at an outside of said sensor chip, said second bump electrode being for wire-bonding; and
   a sealing member interposed between said main surface of said semiconductor substrate and said circuit chip so that said sensing portion is contained in an air tight space formed by said sealing member,
   wherein said first bump electrode and said second bump electrode are made of an identical material.

2. A semiconductor device according to claim 1, wherein said first bump electrode and said sealing member are formed on said circuit chip, and electrode pad and a joining pad to be bonded to said first bump electrode and said sealing member are respectively formed on said sensor chip.

3. A semiconductor device according to claim 2, wherein said electrode pad and said joining pad are formed by same material.

4. A semiconductor device according to claim 2, wherein:
   each of said first bump electrode and said sealing member is composed of a bump part and a solder part made of a solder material; and
   said electrode pad and said joining pad are made of a metallic material which forms a metallic compound with said solder material.

5. A semiconductor device according to claim 1, wherein said first bump electrode, said second bump electrode, and said sealing member are made of the identical material.

6. A semiconductor device according to claim 1, wherein said first bump electrode is composed of a bump part, and a solder part made of a solder material and interposed between said bump part and said sensor chip, said bump part being made of the identical material with said second bump electrode.

7. A semiconductor device according to claim 6, wherein said bump part of said first bump electrode has a height from said circuit chip equal to that of said second bump electrode.

8. A semiconductor device according to claim 6, wherein said sealing member is composed of a bump part, and a solder part made of the solder material, said bump part being made of the identical material with said bump part of said first bump electrode and said second bump electrode.

9. A semiconductor device according to claim 8, wherein said bump part of said first bump electrode, said bump part of said sealing member and said second bump electrode are formed simultaneously on the circuit chip.

10. A semiconductor device according to claim 6, wherein said bump electrode, said sealing member, and said wire-bonding electrode are formed simultaneously on said circuit board.

11. A semiconductor device comprising:
a sensor chip comprising:
a substrate;
an insulating film disposed on said substrate;
a sensing portion disposed on said insulating film, said sensing portion comprising a first semiconductor region, said first semiconductor region comprising a moveable structure and a fixed structure wherein a force applied to said moveable structure results in displacement of said moveable structure relative to said fixed structure;
a sealing portion disposed on said insulating film, said sealing portion comprising a second semiconductor region surrounding and separated from said sensing portion;
a groove separating said sensing portion and said sealing portion, said groove providing electrical isolation between said sensing portion and said sealing portion;
a circuit chip comprising a processing circuit, said circuit chip being constructed and arranged to face said sensor chip;
a bump electrode interposed between said fixed structure of said sensing portion and said circuit chip, said bump electrode forming an electrical connection between said sensing portion and said processing circuit; and
a sealing member positioned between said sealing portion and said circuit chip to form a seal between said sensor chip and said circuit chip and thereby define an enclosed space containing said sensing portion.

12. A semiconductor device according to claim 11, wherein:
said bump electrode and said sealing member are formed on a circuit chip side; and
an electrode pad and a joining pad to be bonded to said bump electrode and said sealing member are respectively formed on a sensor chip side.

13. A semiconductor device according to claim 12, wherein said electrode pad and said joining pad are made of same material.

14. A semiconductor device according to claim 12, wherein:
said bump electrode and said sealing member are made of solder material; and
said electrode pad and said joining pad are made of metallic material which forms a metallic compound with said solder material.

15. A semiconductor device according to claim 11, wherein:
said bump electrode and said sealing member are made of same material.

16. A semiconductor device according to claim 11, further comprising a wire-bonding electrode provided on said circuit chip at an outside region other than a region facing the sensor chip, for being wire-bonded to a wire, wherein:
said wire-bonding electrode and said bump electrode are made of an identical material with each other.

17. A semiconductor device according to claim 16, wherein said bump electrode is composed of a bump part, and a solder part made of a solder material and interposed between said bump part and said sensor chip, said bump part being made of the identical material with said wire-bonding electrode.

18. A semiconductor device according to claim 17, wherein said bump part of said first bump electrode has a height from said circuit chip equal to that of said wire-bonding electrode.

19. A semiconductor device according to claim 17, wherein said sealing member is composed of a bump part, and a solder part made of said solder material and interposed between said bump part and said sensor chip, said bump part being made of the identical material with said bump part of said bump electrode and said wire-bonding electrode.

20. A semiconductor device according to claim 19, wherein said bump part of said bump electrode, said bump part of said sealing member, and said wire-bonding electrode are formed simultaneously on said circuit chip.

* * * * *